United States Patent
Li et al.

(10) Patent No.: US 10,020,380 B2
(45) Date of Patent: Jul. 10, 2018

(54) POWER DEVICE WITH HIGH ASPECT RATIO TRENCH CONTACTS AND SUBMICRON PITCHES BETWEEN TRENCHES

(71) Applicant: Alpha & Omega Semiconductor, Incorporated, Sunnyvale, CA (US)

(72) Inventors: Wenjun Li, Portland, OR (US); Paul Thorup, Hillsboro, OR (US); Hong Chang, Saratoga, CA (US); Yeeheng Lee, San Jose, CA (US); Yang Xiang, Beaverton, OR (US); Jowei Dun, San Jose, CA (US); Hongyong Xue, Portland, OR (US); Yiming Gu, Hillsboro, OR (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/603,871

(22) Filed: Jan. 23, 2015

(65) Prior Publication Data
US 2016/0218008 A1   Jul. 28, 2016

(51) Int. Cl.
*H01L 21/28*   (2006.01)
*H01L 29/423*   (2006.01)
*H01L 29/66*   (2006.01)
*H01L 29/778*   (2006.01)
*H01L 21/265*   (2006.01)

(52) U.S. Cl.
CPC .... *H01L 29/66666* (2013.01); *H01L 21/2658* (2013.01); *H01L 21/28035* (2013.01); *H01L 29/4236* (2013.01)

(58) Field of Classification Search
CPC ........... H01L 29/78642; H01L 29/7827; H01L 29/66666; H01L 29/4236; H01L 21/2658; H01L 21/28035
USPC ......... 257/331, 330, E21.585; 438/270, 268, 438/589, 639, 275
See application file for complete search history.

(56) References Cited

U.S. PATENT DOCUMENTS

| | | | | |
|---|---|---|---|---|
| 5,366,914 A | * | 11/1994 | Takahashi et al. | 438/270 |
| 8,058,670 B2 | * | 11/2011 | Hshieh | 257/136 |
| 8,354,334 B2 | * | 1/2013 | Lee, II | 438/584 |
| 8,629,019 B2 | * | 1/2014 | Xu et al. | 438/270 |
| 2003/0119329 A1 | * | 6/2003 | Lee | 438/710 |

(Continued)

*Primary Examiner* — Cuong Q Nguyen
*Assistant Examiner* — Tong-Ho Kim
(74) *Attorney, Agent, or Firm* — Bo-In Lin

(57) ABSTRACT

This invention discloses a semiconductor power device disposed in a semiconductor substrate including an active cell areas and a termination area. The semiconductor power device further comprises a plurality of gate trenches formed at a top portion of the semiconductor substrate in the active cell area wherein each of the gate trenches is partially filled with a conductive gate material with a top portion of the trenches filled by a high density plasma (HDP) insulation layer. The semiconductor power device further comprises mesa areas of the semiconductor substrate disposed between the gate trenches wherein the mesa areas are recessed and having a top mesa surface disposed vertically below a top surface of the HDP insulation layer wherein the HDP insulation layer covering over the conductive gate material constituting a stick-out boundary-defining layer surrounding the recessed mesa areas in the active cell areas between the gate trenches.

10 Claims, 23 Drawing Sheets

(56) References Cited

U.S. PATENT DOCUMENTS

2011/0241106 A1* 10/2011 Lee et al. .................. 257/330
2012/0146090 A1*  6/2012 Lui et al. .................. 257/139
2012/0326207 A1* 12/2012 Yoshimochi ............... 257/139

* cited by examiner

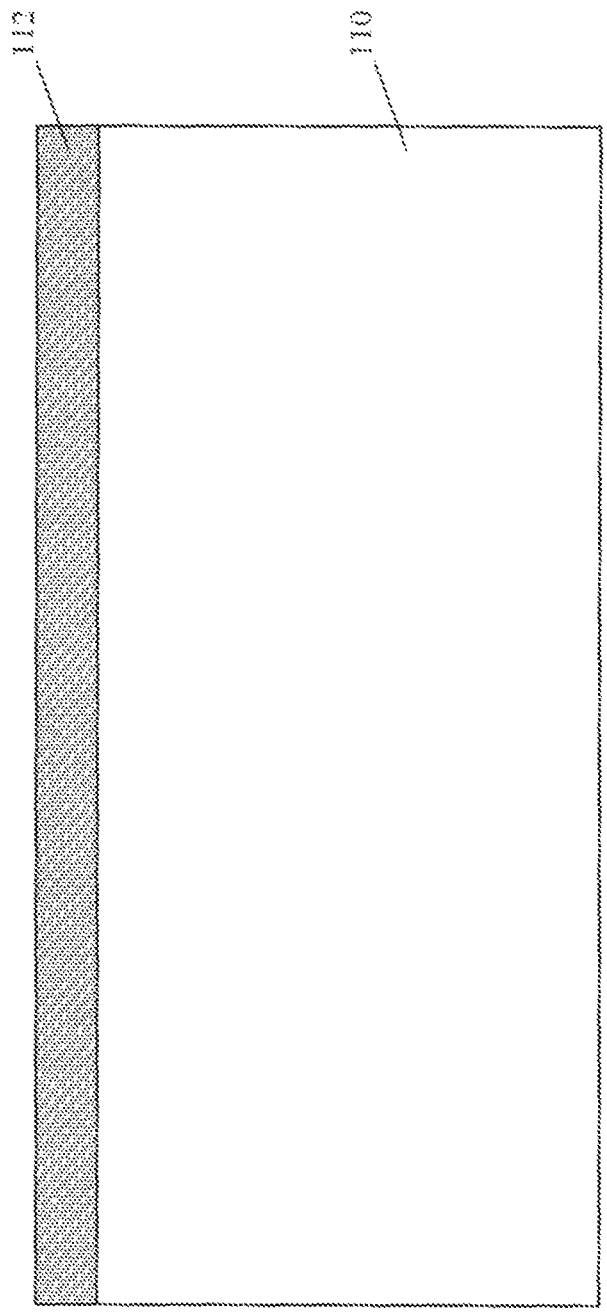

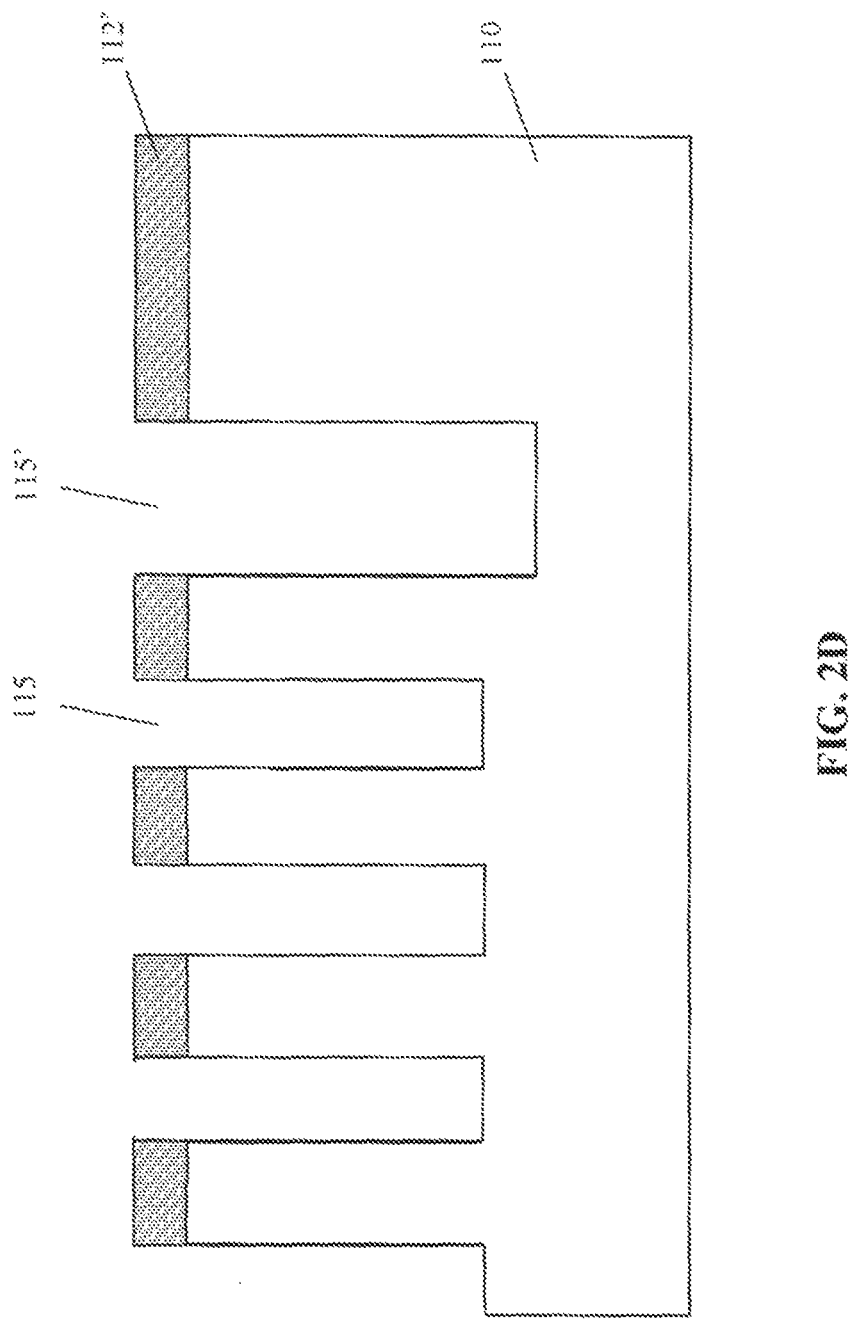

POWER DEVICE WITH HIGH ASPECT RATIO TRENCH CONTACTS AND SUBMICRON PITCHES BETWEEN TRENCHES

BACKGROUND OF THE INVENTION

1. Field of the Invention

The invention relates generally to the manufacturing processes and structures of semiconductor power devices. More particularly, this invention relates to manufacturing processes and structural configurations of improved deep contact trench with reduced critical dimension having shrunken distance between the deep trench contacts.

2. Description of the Prior Art

Conventional methods of manufacturing semiconductor power device are still confronted with technical limitations to make electrical contact in trenches with high aspect ratio and small pitches between these trenches. The technical limitations often become a bottleneck that hinders further reductions of the size and dimension of the electronic device. For these reasons, many techniques have been applied in attempt to overcome these limitations.

Conventional technologies by applying the photolithographic processes are employed to define patterns for opening contact trenches. Typically, photoresist layers are deposited and patterned by selectively exposing the photoresist layer by applying masks to define locations for opening the contact trenches. However, such processes are limited due to the difficulties of properly alignments. Furthermore, the depth of focus and the resolutions of the photolithographic exposures also cause deviations and inaccuracies that demand manufacturing tolerances and hinder the abilities of the manufacturing processes to fabricate device that have contact trenches with submicron pitches.

In U.S. Pat. No. 8,629,019 Xu et al. disclose a method for manufacturing self-aligned contacts for a trench power MOSFET. The method includes, etching trenches in a substrate through a mask of silicon nitride deposited on an oxide layer, forming a gate oxide layer on the walls of the trenches. The gate oxide layer on the sidewalls of the trenches is then applied to self-align the gate bus by filling the gate trenches with a polysilicon layer. Similarly, contact windows to source and body regions are also defined in a silicon nitride for etching the silicon nitride on top of an oxide layer covering over the source and body region. Spacers are grown on sidewalls of these contact windows to self-align the contact metal deposited into these contact windows formed as trenches in the silicon nitride layer having spacers on the sidewalls. The methods disclosed by Xu et al. as disclosed in the patented invention are still limited by the fact that masks are applied first to define the locations on the silicon nitride layer covering over the top surface of the device. Due to the tolerance that is required for allowing small degrees of inaccuracy for the placement of the mask on a flat surface, there are still limit that would hinder the reductions of the pitches between the trench contacts. Even though different contact metals as that disclosed by Xu et al. are formed in the contact trenches in a self-aligned fashion, the contact trenches themselves are not formed by applying a self-aligned process.

Therefore, a need still exists for the ordinary skill in the art to improve the methods of manufacturing of the power devices, particularly the trench contacts to be accurately formed at different locations over the entire top surface area of the power device to resolve these technical limitations. It is the purpose of this invention to provide new and improved methods of manufacturing, structural features and device configurations to precisely place the contact trenches by a self-aligned process such that the above-discussed difficulties and limitations can be overcome.

SUMMARY OF THE PRESENT INVENTION

It is therefore an aspect of the present invention to provide a new and improved method of manufacturing a semiconductor power device by applying a selective etch process to form a self-aligned structural feature with recessed grooves in the mesa area between the trenched gates whereby the sidewalls of the recessed grooves define the outer boundaries of the locations of the trench contacts. The required tolerances to allow for inaccuracies in placing the masks relative to the trench gates as that encountered in the conventional manufacturing processes are therefore resolved.

It is another aspect of the present invention to provide a new and improved method of manufacturing a semiconductor power device by further carrying out an oxide spacer on the sidewalls of the recessed groves of the epitaxial layer to further narrow and define the locations of the trench contacts substantially in the middle portion of the recess grooves. A process to etch the contact trenches with high aspect ratio can therefore carry out with precisely defined locations without requiring the conventional methods of applying masks. The locations of the contact trenches are precisely defined right in the middle of the source and body region in the mesa area in a totally self-aligned fashion.

Therefore, by applying the manufacturing processes of this invention, the distance between the trenches can also be precisely defined and formed without the uncertainties and tolerances as that required in the conventional method such that the pitch of the cell of the power device can be reduced.

In a preferred embodiment, this invention discloses a semiconductor power device disposed in a semiconductor substrate. The semiconductor power device comprises an active cell areas and a termination area. The semiconductor power device further comprises a plurality of gate trenches formed at a top portion of the semiconductor substrate in the active cell area wherein each of the gate trenches is partially filled with a conductive gate material with a top portion of the trenches filled by a high density plasma (HDP) insulation layer. The semiconductor power device further comprises mesa areas of the semiconductor substrate disposed between the gate trenches wherein the mesa areas are recessed and having a top mesa surface disposed vertically below a top surface of the HDP insulation layer wherein the HDP insulation layer covering over the conductive gate material constituting a stick-out boundary-defining layer surrounding the recessed mesa areas in the active cell areas between the gate trenches.

In a preferred embodiment, this invention further discloses a method for manufacturing a semiconductor power device on a semiconductor substrate comprising an active cell areas and a termination area. The method includes steps of a) opening a plurality of gate trenches in a top portion of the semiconductor substrate in the active cell area and filling each of the gate trenches with a conductive gate material followed by etching off the conductive gate material from a top portion of the trenches; b) depositing a high density plasma (HDP) oxide layer and forming a BPSG insulation layer covering over a top surface followed by applying a self-aligned contact (SAC) photoresist mask to carry out a self-aligned contact etch to remove the BPSG insulation and the HDP oxide layers from a top surface of the semiconductor substrate in an uncovered area; and c) performing a mesa recess etch to etch the semiconductor substrate to form a mesa recess with a top mesa surface vertically below a top surface of the HDP insulation layer covering over the conductive gate material constituting a stick-out boundary-defining layer surrounding the recessed mesa areas in the active cell areas between the gate trenches.

These and other objects and advantages of the present invention will no doubt become obvious to those of ordinary skill in the art after having read the following detailed description of the preferred embodiment, which is illustrated in the various drawing figures.

DETAILED DESCRIPTION OF THE EMBODIMENTS

Figure 1A:
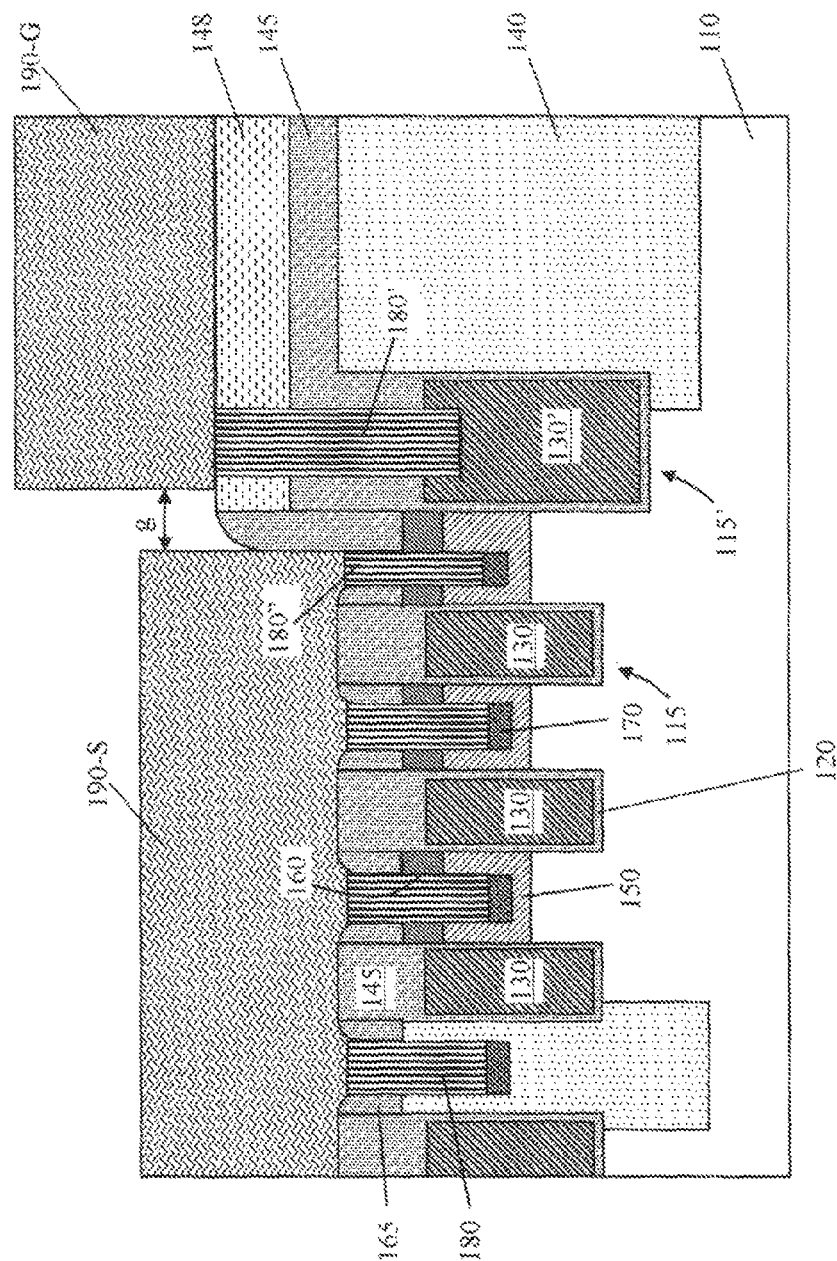
FIGS. 1A and 1B are side cross sectional views for depicting semiconductor power devices manufactured by applying methods and structural features of this invention.

FIG. 1A is a side cross sectional view of a power device with deep trench contact structures manufactured by applying the processing steps of this invention. The power device is supported in an N-type epitaxial layer 110 formed on top of an N-type semiconductor substrate (not shown). The semiconductor power device includes an active cell region extended over an area covered by a top source metal 190-S and a termination area covered by a gate pad metal layer 190-G. The power device comprises a plurality of trenched gates 130 formed in deep trenches 115 padded with a gate oxide layer 120, where each of the trenched gates is surrounded by a P-type body region 150 with the body region 150 encompassing a N-type source region 160. The power device further includes a plurality of source/body contacts 180 formed as a deep trench contact 180. Each of these deep contact trenches penetrates through a HDP oxide layer 145, vertically extends below the source regions 160 and further penetrates through a top portion of the body region 160 contacts to a contact implant region 170 formed in the body region 150 and is filled with a metal layer forming the source/body contact 180. Each of these source/body contact 180 further directly contacts to the source metal 190-S covering over the top of the HDP oxide layer 145 and the spacer layer 165. The center of the source/body contact 180 is substantially aligned with the center of the mesa between two adjacent active trenches 115. However, in the mesa between the last active trench 115 and the gate pick up trench 115', the source/body contact 180" is off center of the mesa closer to the last active trench. In this embodiment, the semiconductor power device further comprises a body clamping layer (BCL) 140 formed as boron implant regions for clamping the BVdss. The polysilicon gate pickup 130' formed in a deep gate pickup trench 115' padded with a gate oxide layer 120 contacts to the metal layer 190-G metal layer through a pickup contact 180' penetrating through the HDP oxide layer 145 and the BPSG layer 148 and vertically extending through a top portion of the polysilicon gate pickup 130', where the gate pickup 130' has a greater width than that of the trenched gates 130 in the active cell area. A gap g separating the source metal 190-S and gate metal 190-G extends across the edge of the HDP oxide layer 145 and the BPSG layer 148 substantially aligned with the trench sidewall of the gate pick up trench 115' closer to the active trenches 115.

Figure 1B:
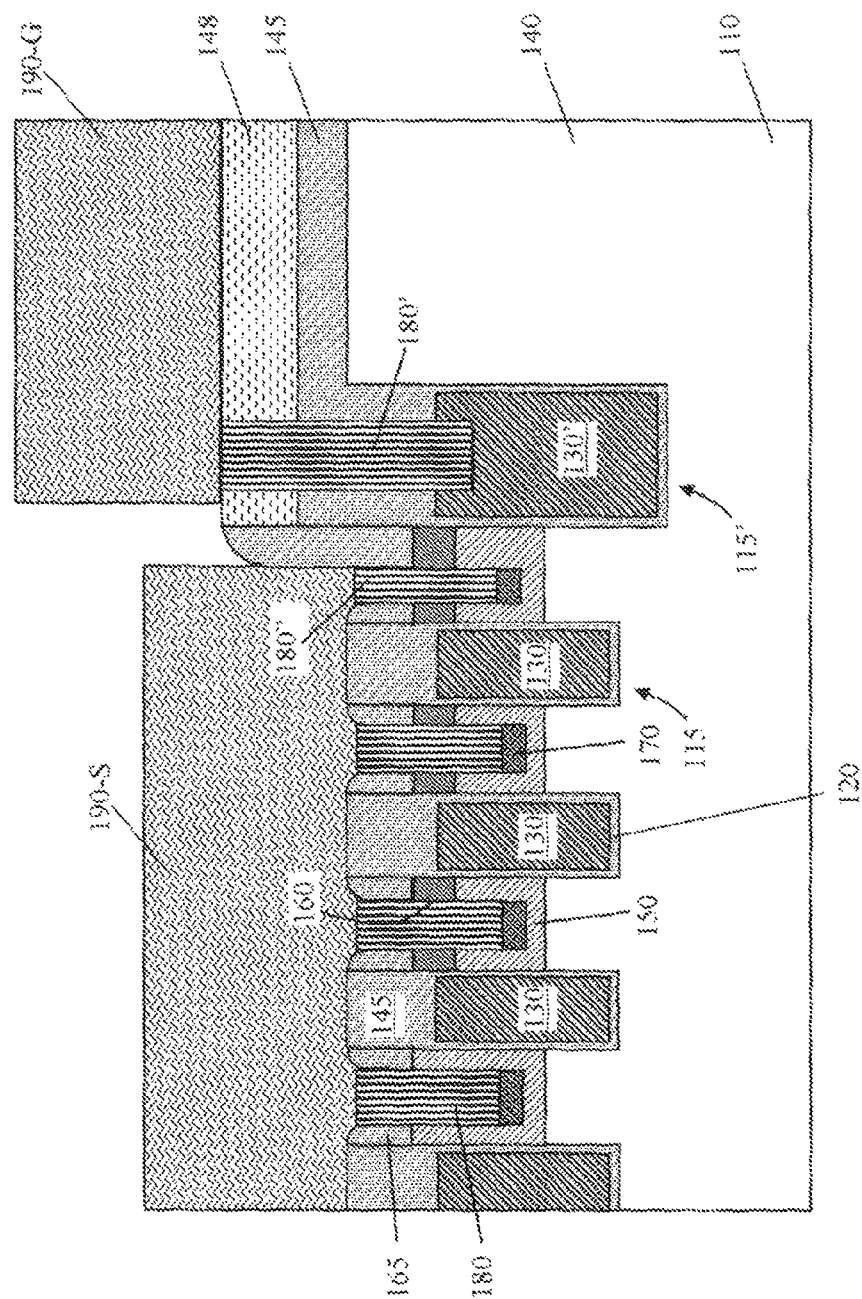

FIG. 1B is a side cross sectional view of an alternative power device of this invention, which is similar to the power device of FIG. 1A, excepting that the termination area does not include the BCL layer 140.

Figure 1C:
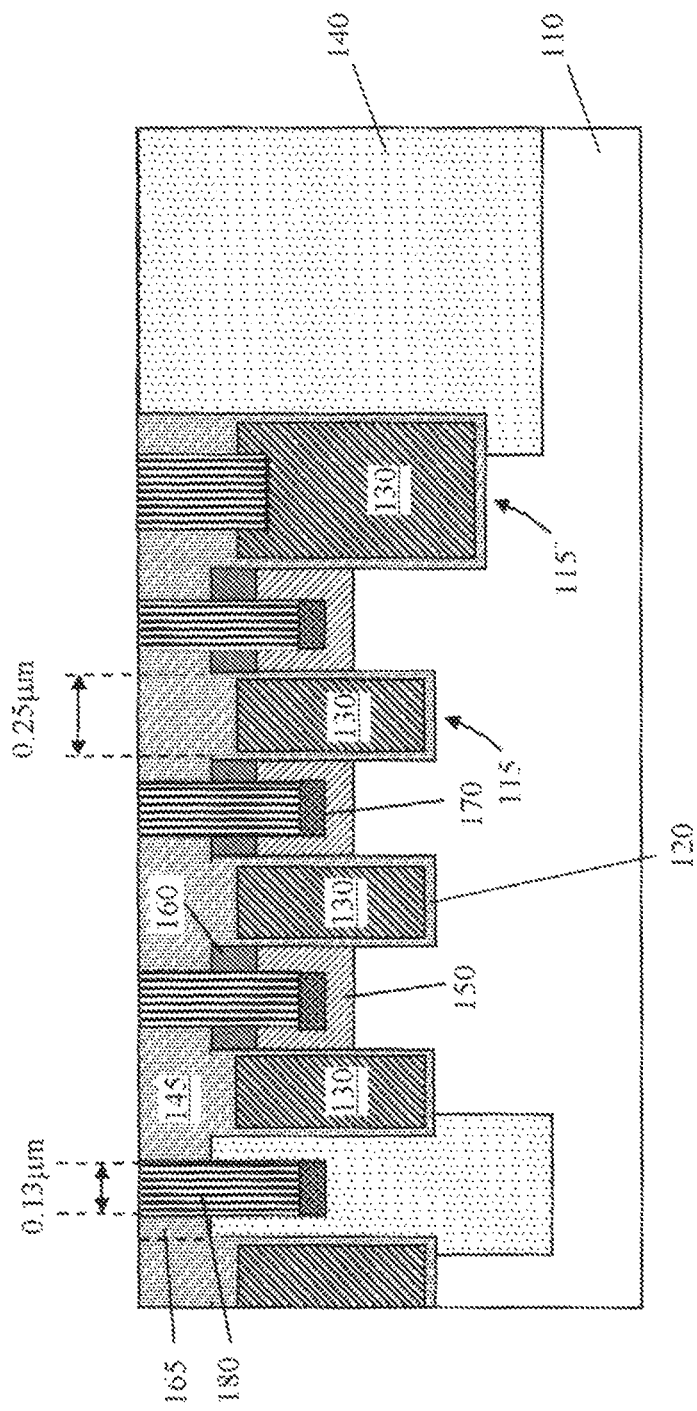
FIG. 1C is a side cross section view for depicting special structural features of the semiconductor power device for the device shown in FIG. 1A.

FIG. 1C shows the special structural features of the semiconductor power device for the device shown in FIG. 1A. Specifically, the width of the source/body trench contacts 180 is now reduced to about 0.1 to 0.2 micron, for example 0.13 micron, and the pitch between the deep contact trenches is reduced to about 0.2 to 0.3 micron, for example 0.25 micron.

Figure 2B:
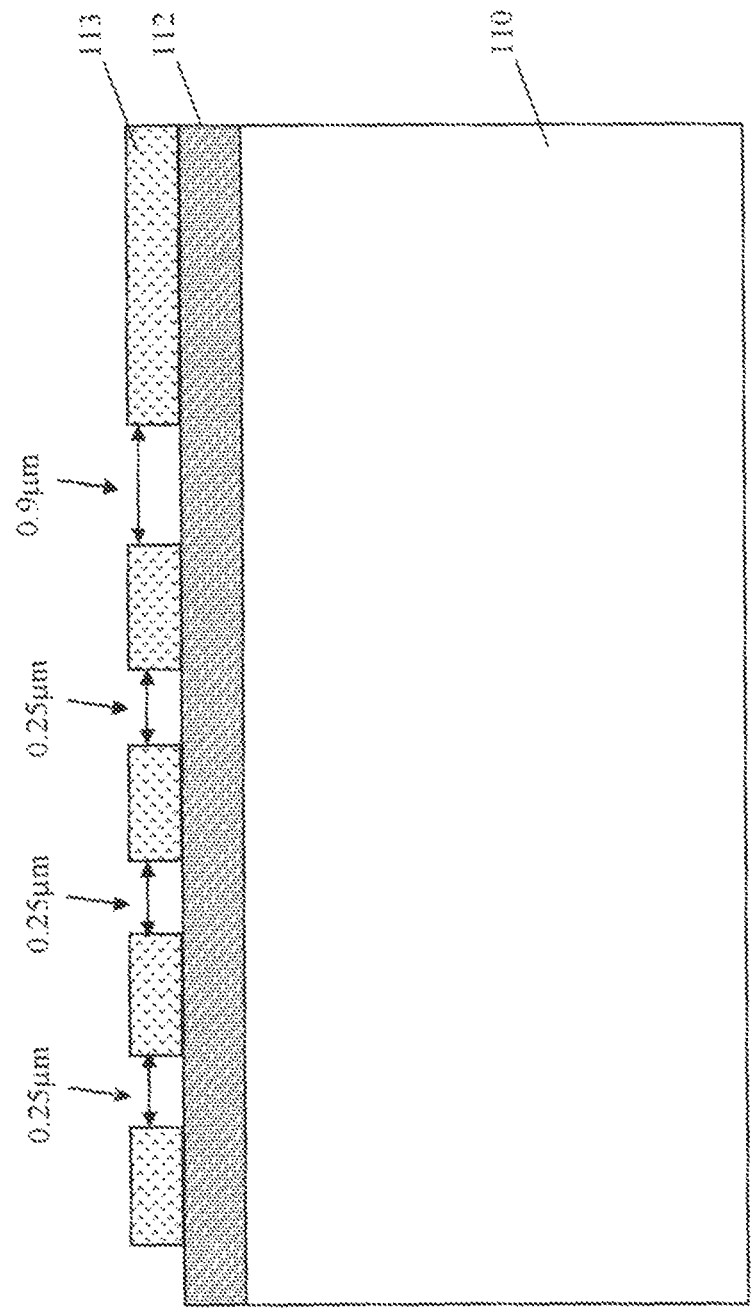
FIG. 2A to 2T are series of cross sectional views to illustrate the processing steps for manufacturing a semiconductor power device of this invention as that shown in FIGS. 1 and 1A.
Figure 2C:
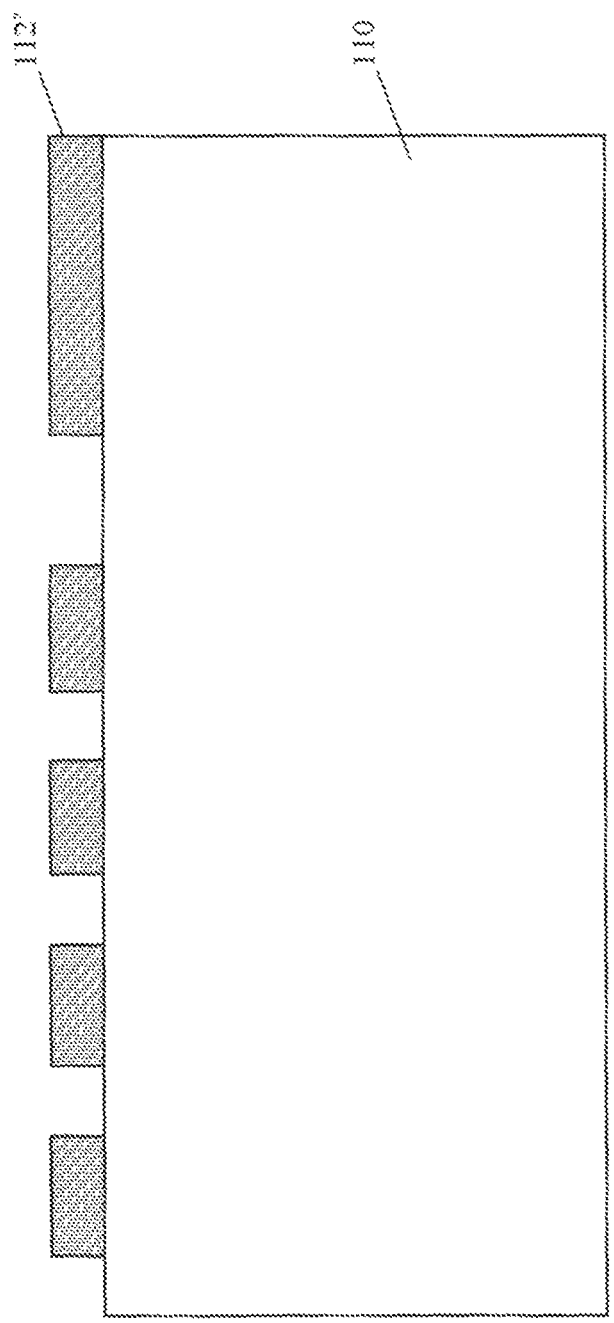
Figure 2E:
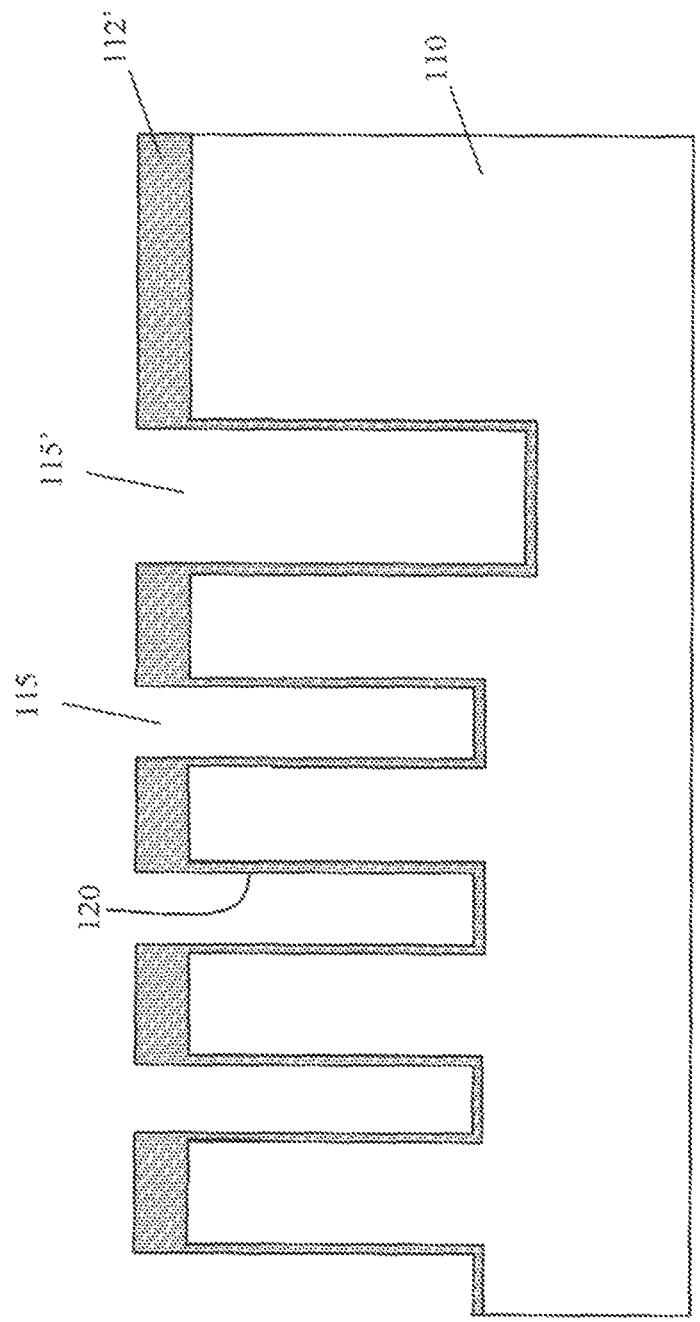
Figure 2F:
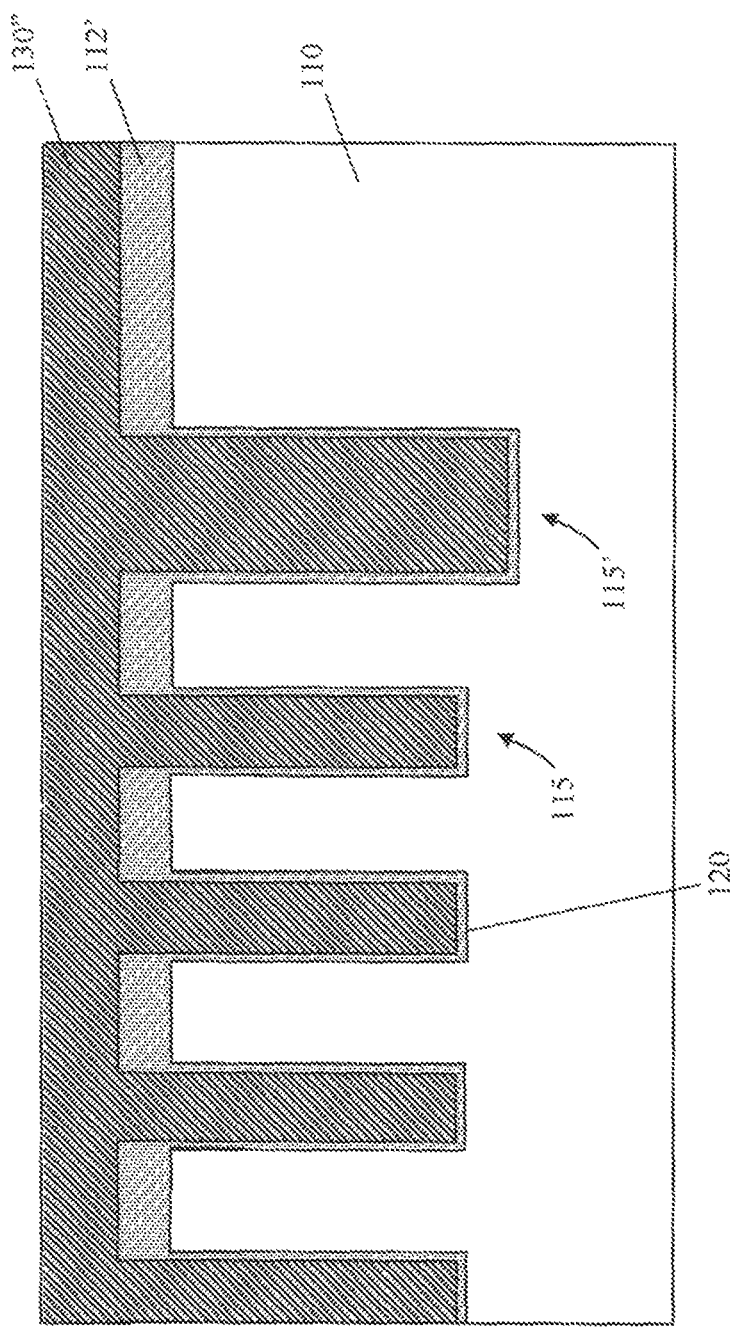
Figure 2G:
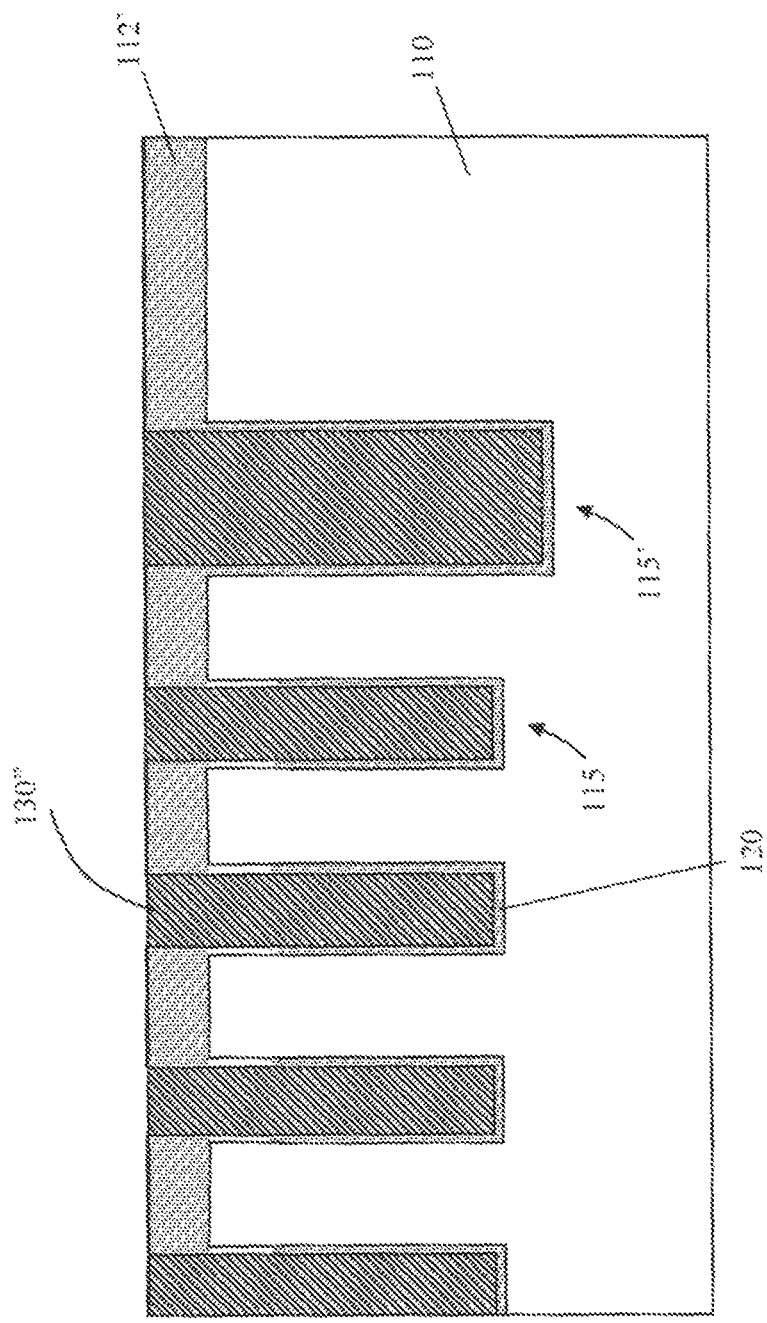
Figure 2H:
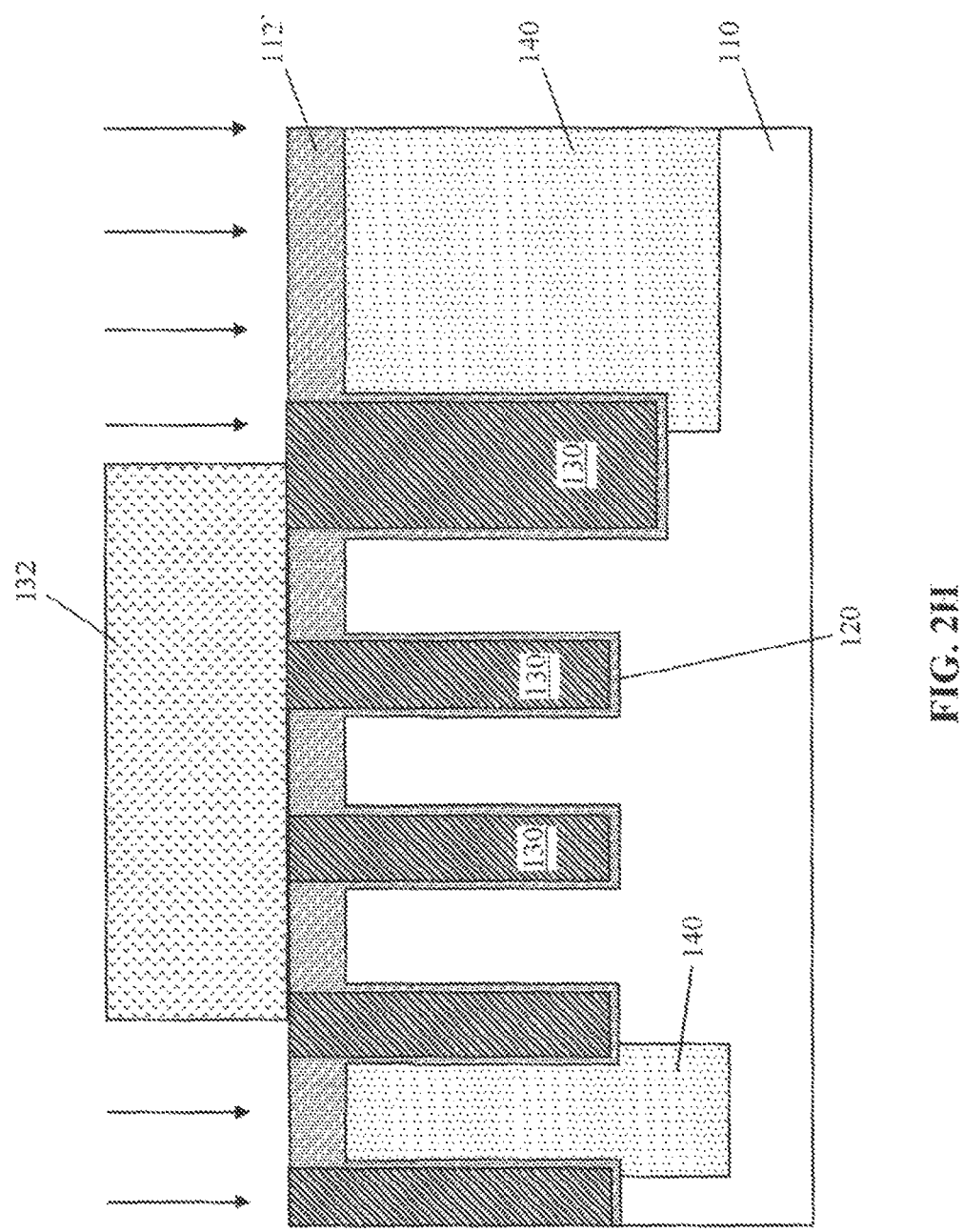
Figure 21:
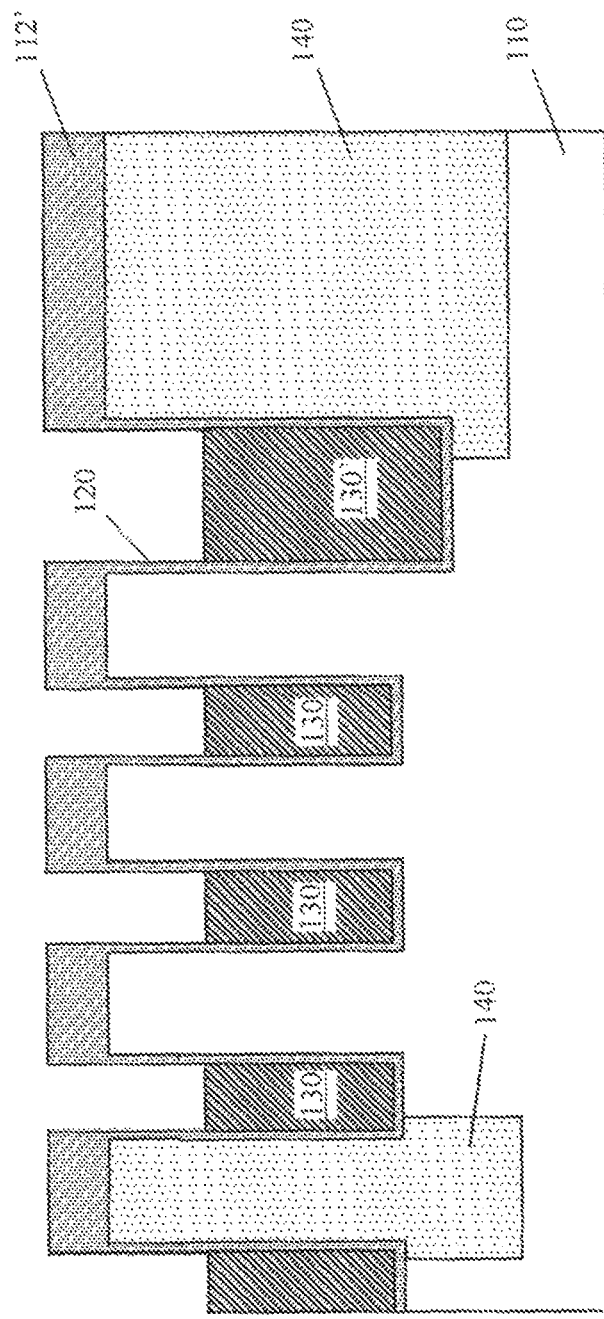
Figure 2I:
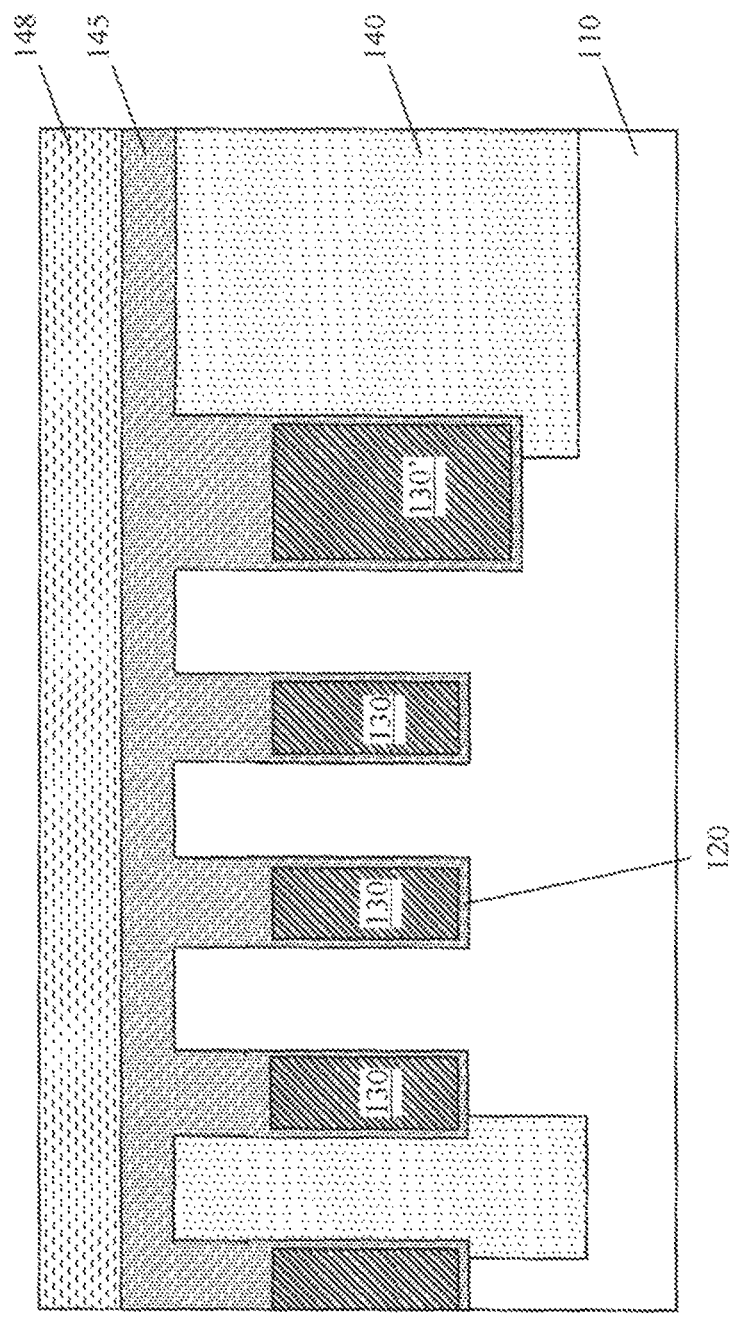
Figure 2K:
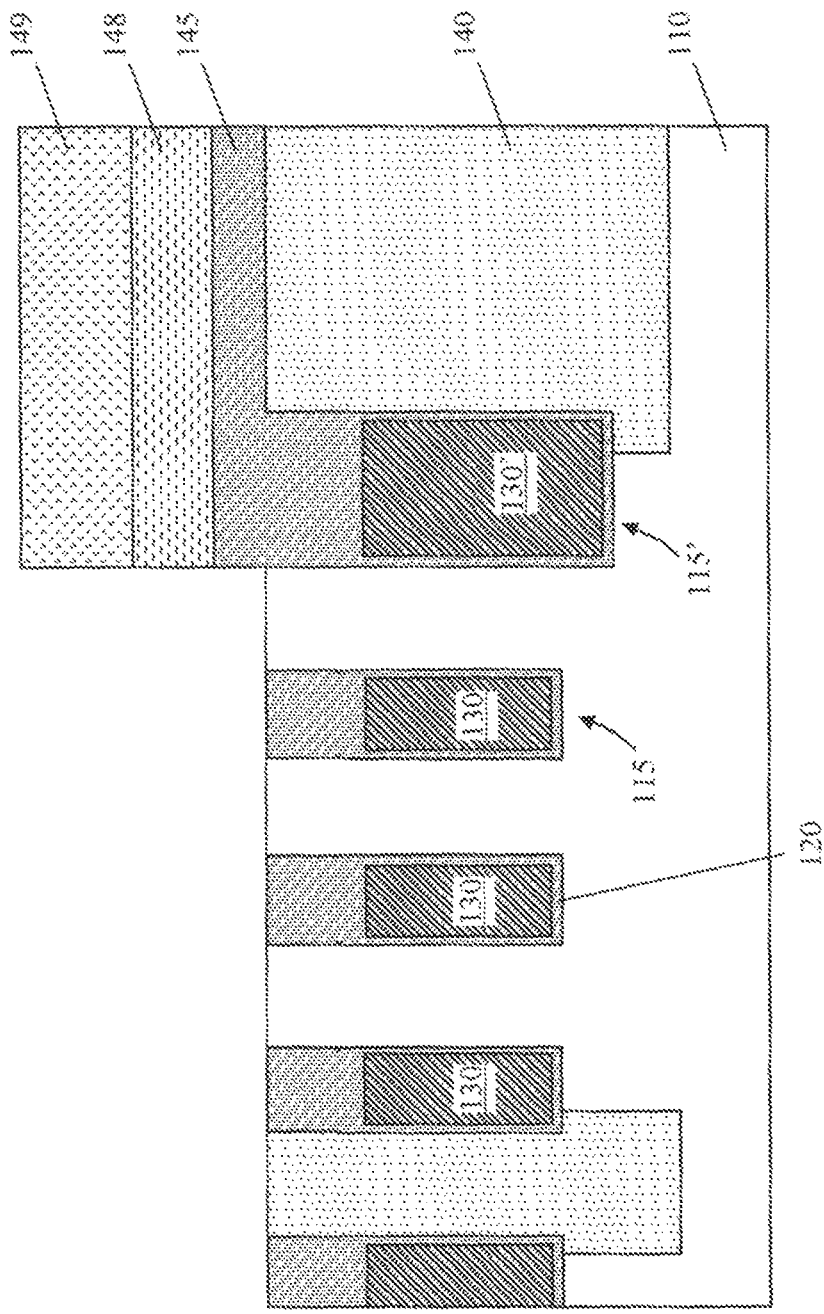
Figure 2L:
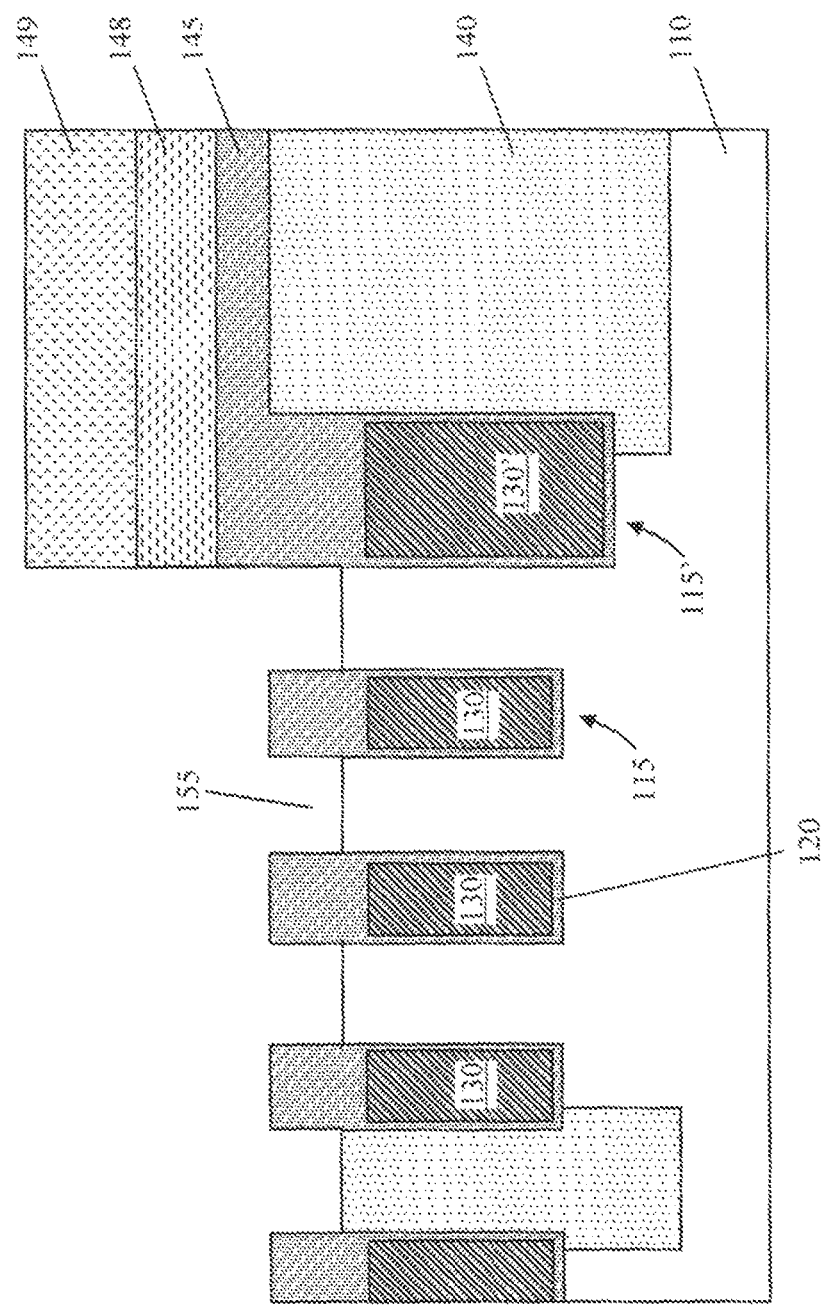
Figure 2M:
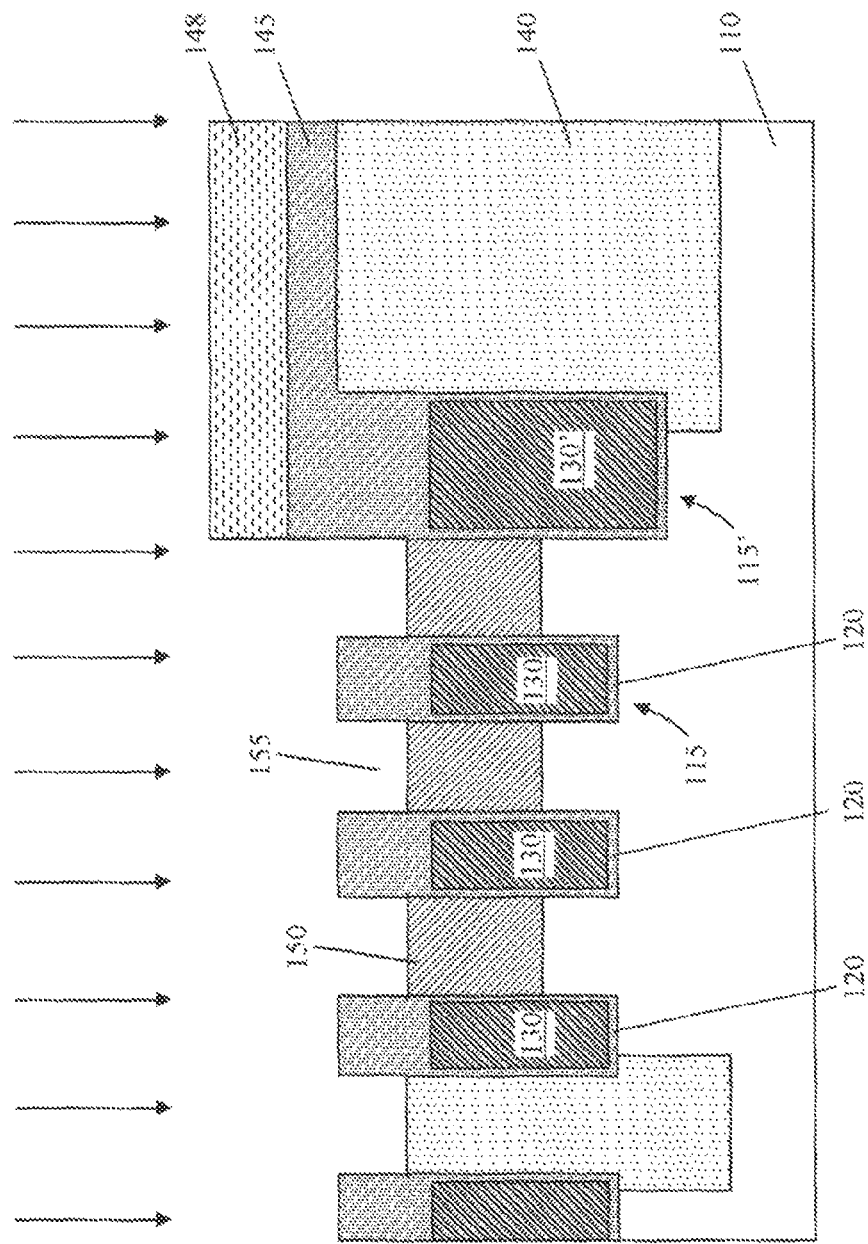
Figure 2N:
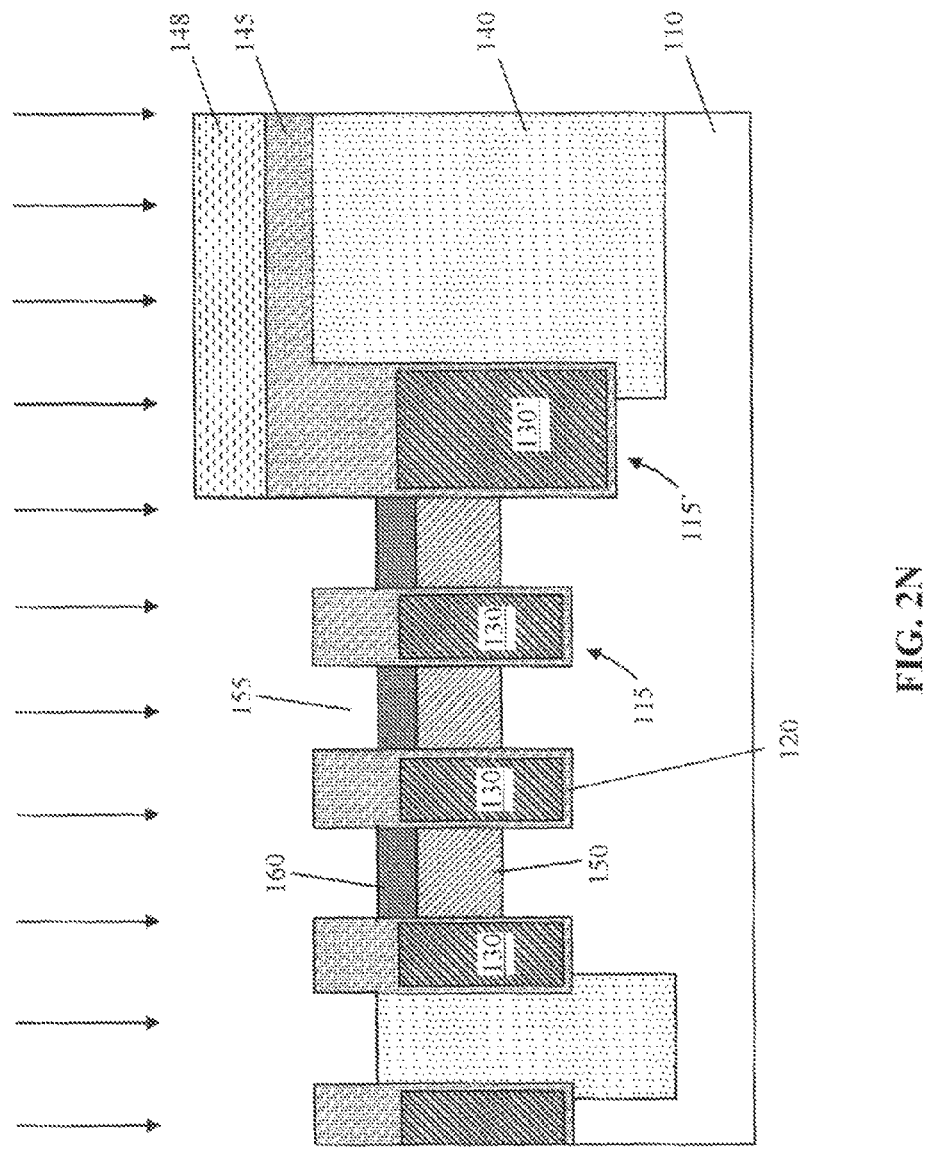
Figure 20:
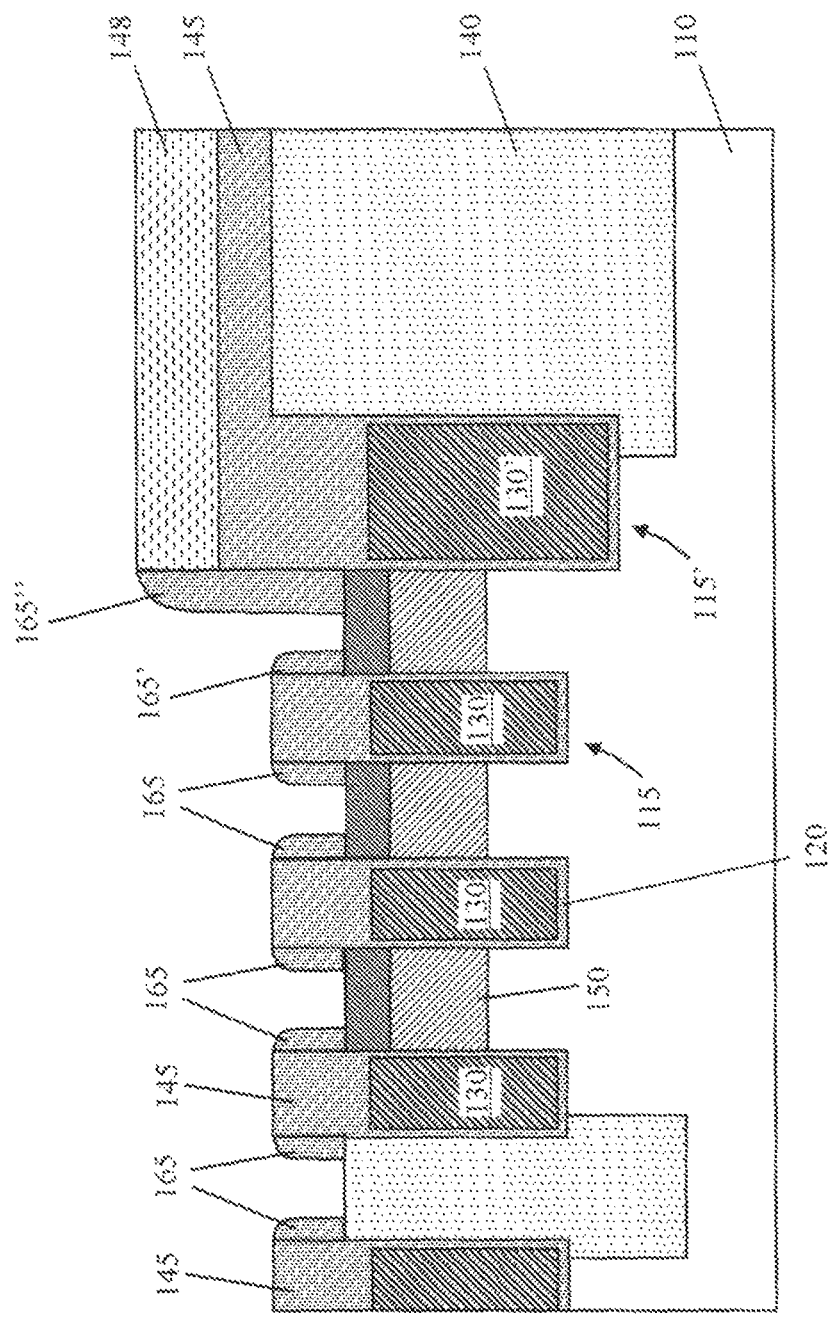
Figure 2P:
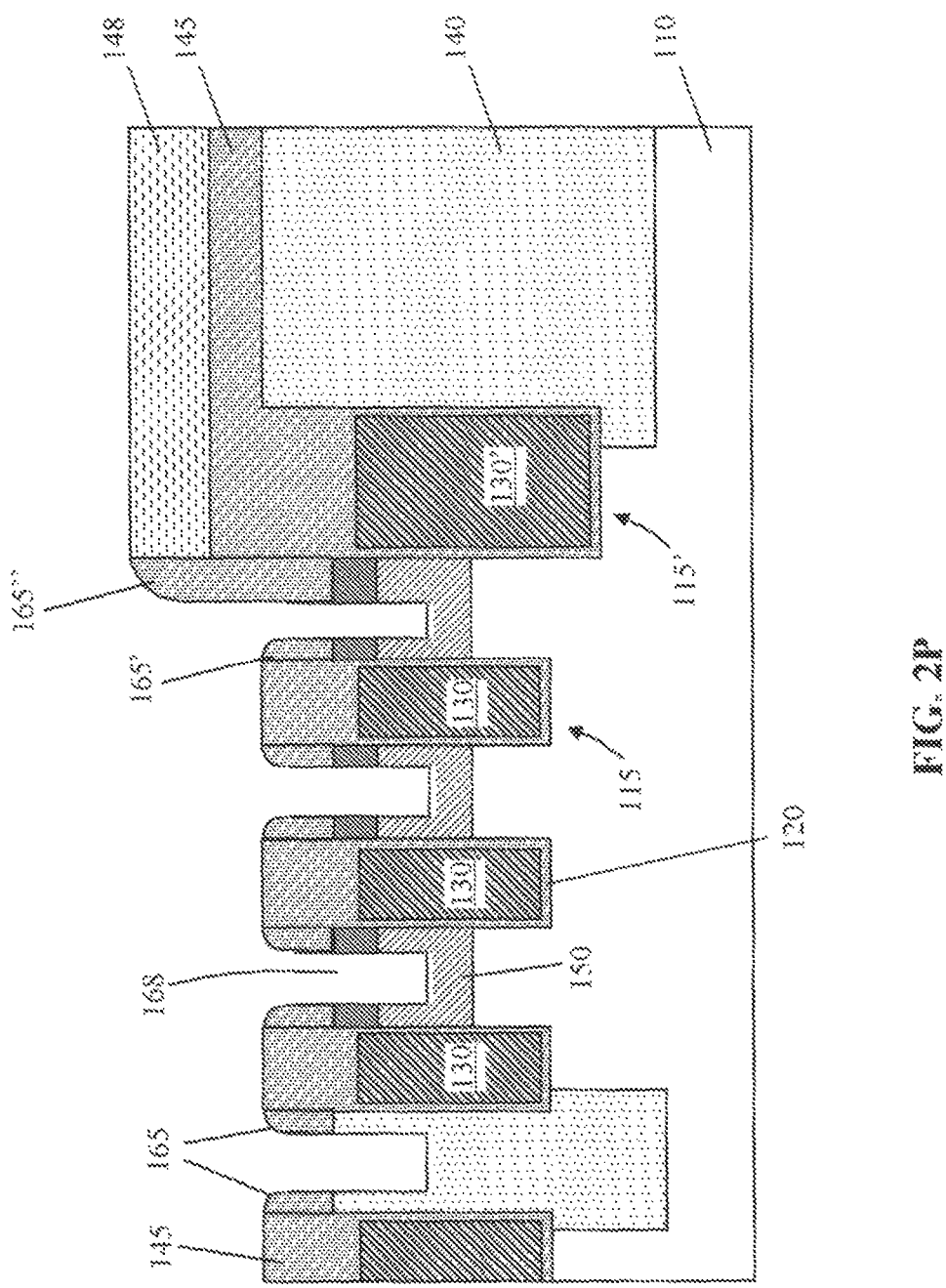
Figure 2Q:
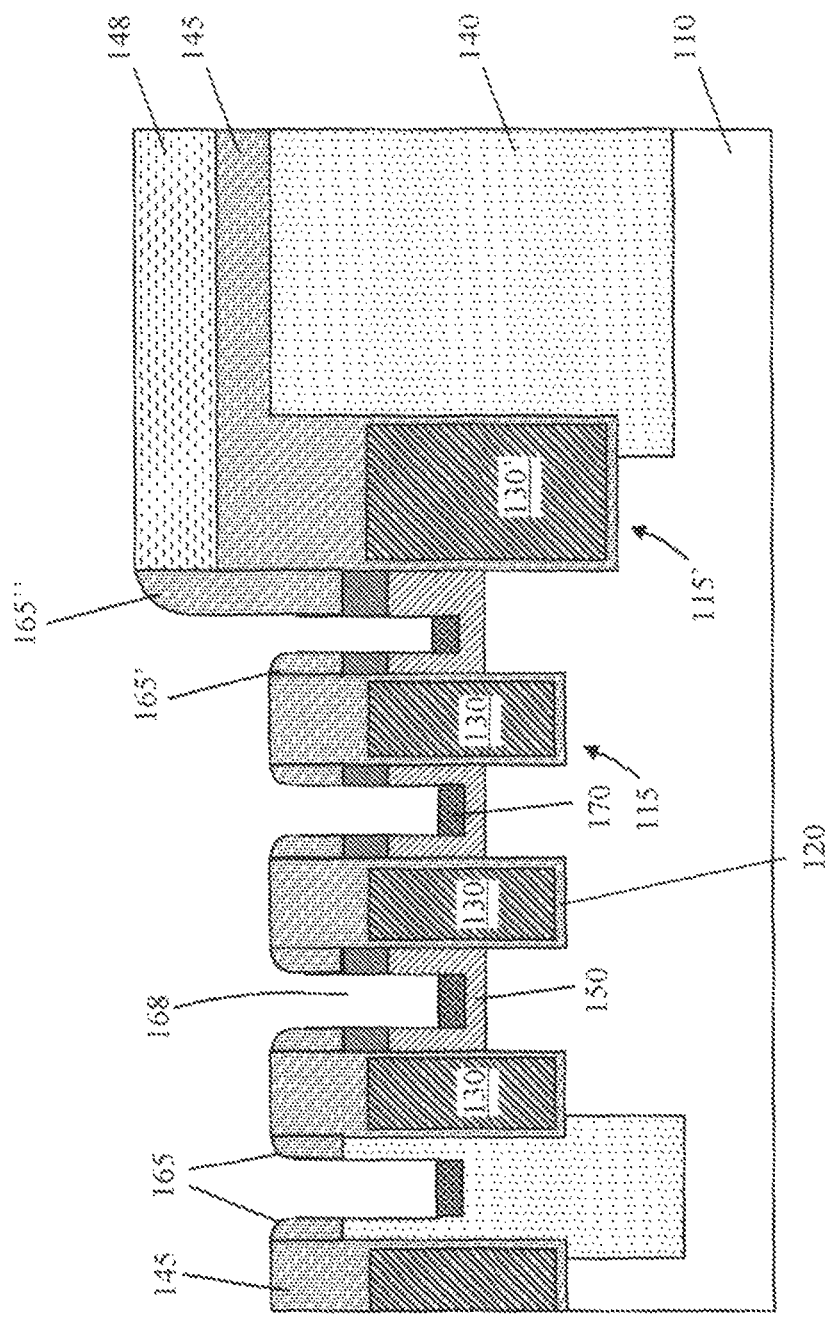
Figure 2R:
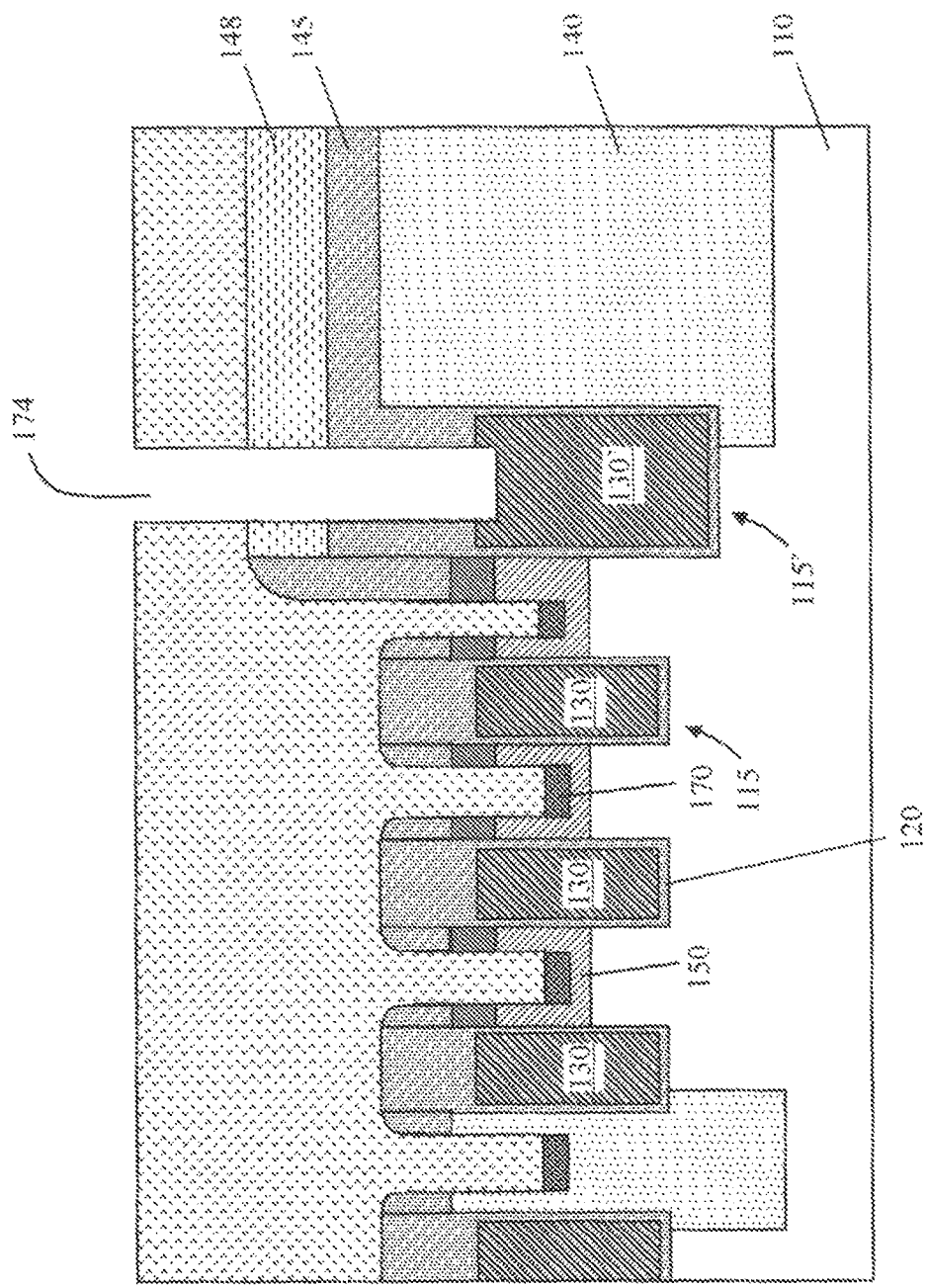
Figure 2S:
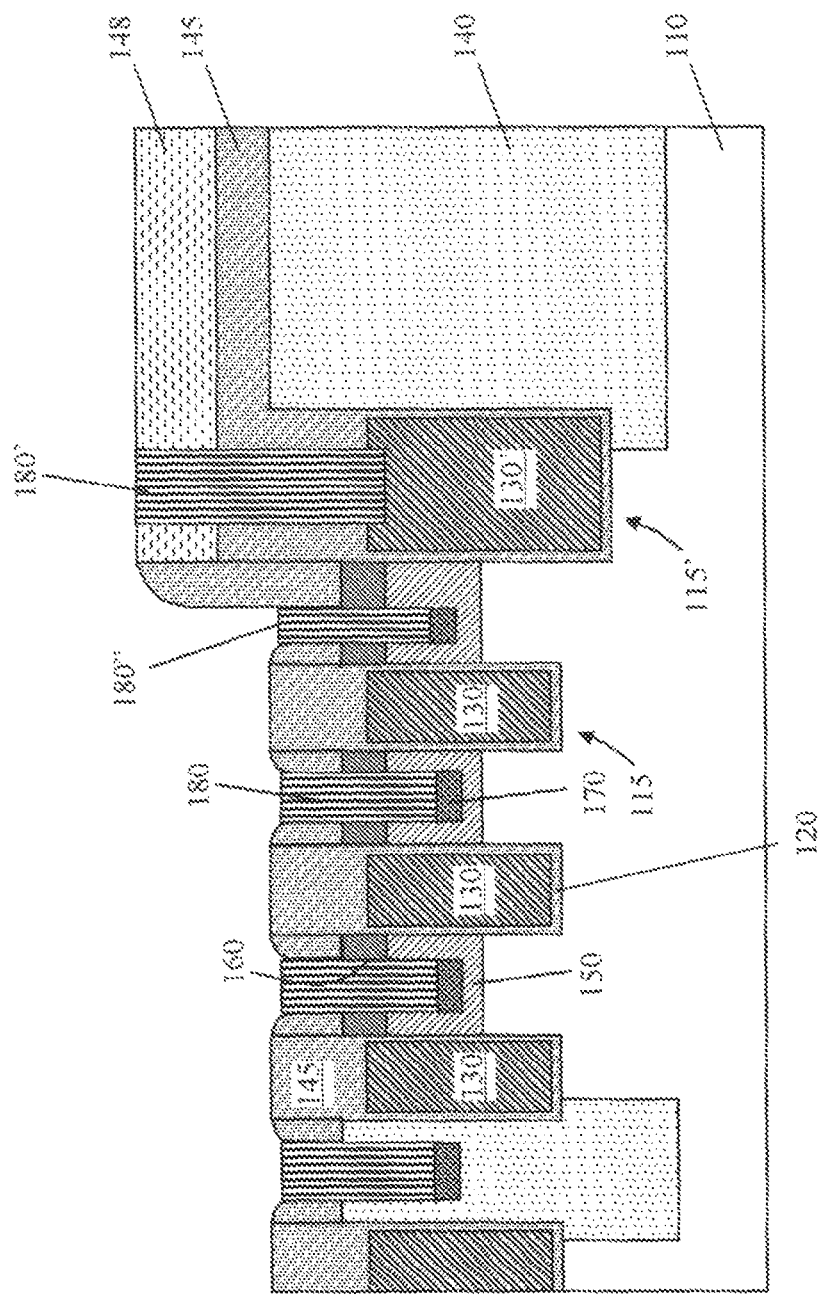
Figure 2T:
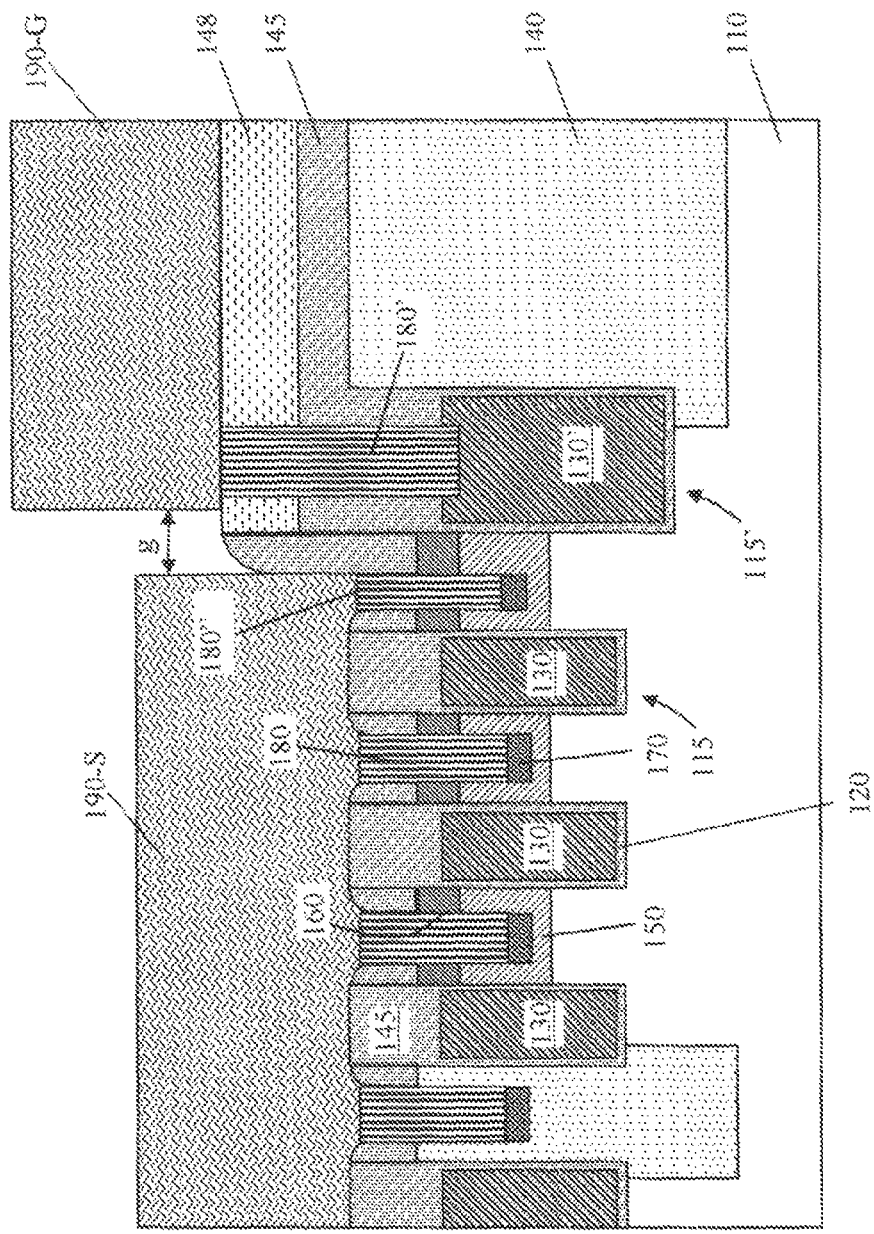

FIGS. 2A to 2T are a series of side cross sectional views illustrating the processing steps of forming the deep trench contact structures to reduce the cell pitches of a semiconductor power device of FIG. 1A according to the configuration and methods of the present invention. In FIG. 2A, a thermal oxide layer 112, which is a hard mask, is grown on top of an N-type epitaxial layer. The epitaxial layer 110 is formed on top of an N-type semiconductor substrate (not shown). The thickness of the thermal oxide layer 112 is approximately 2700 Angstroms. In FIG. 2B, a trench photoresist mask 113, with a critical dimension (CD) substantially around 0.25 micrometers for active trenches and 0.9 micrometers for the gate pickup trench is applied to pattern the hard mask 112 forming a trench hard mask layer 112' followed by removal of the mask 113 as that shown in FIG. 2C.

In FIG. 2D, an etch process is carried out to open trenches 115, 115' with a trench depth for active trenches 115 of approximately 1.45 micrometer. The trench sidewalls are opened not exactly perpendicular relative to the top surface of the substrate and having an angle of about 86.5 degrees. After the trench etch process, a CARO cleaning process is carried out and a portion of the hard mask 112' having a layer thickness of about 1200 Angstroms still remains. In FIG. 2E, a sacrificial oxide pre-cleaning process is carried out using Standard Clean 1 (SC1) process with HF to remove the oxide layer having a thickness of about 50 Angstroms followed by growing another sacrificial oxide layer of about 100 Angstroms and removing 130 Angstroms of a target oxide layer. Then a gate oxide layer 120 having a thickness of about 310 Angstroms covering over the trench sidewalls is grown. The remaining hard mask oxide layer 112' has a thickness of about 1000 Angstroms. In FIG. 2F, an in-situ phosphoric doped polysilicon layer 130" is deposited into the trenches 115, 115' and atop the surface of the hard mask 112' followed by a chemical-mechanical planarization (CMP) process to planarize the top surface of the polysilicon layer 130" and the hard mask layer 112' as that shown in FIG. 2G. The remaining hard mask layer 112' has a thickness of about 800 Angstroms. Then a pre-anneal cleaning process is carried out using CARO, Standard Clean 1 (SC1) and Standard Clean 2 (SC2) cleaning processes followed by performing a poly-anneal process on the polysilicon layer 130" at a temperature of about 1150 degree Celsius.

In FIG. 2H, the processes proceed with the application of a BCL photoresist mask 132 to carry out multiple steps of BCL implantations. In an exemplary embodiment, the implantations includes a) BF2 dopant with a doping concentration of $2E15$ $cm^{-3}$ implanted at 2100 Kev; b) Boron dopant with a doping concentration of $1E15$ $cm^{-3}$ implanted at 100 Kev; c) Boron dopant with a doping concentration of $2E12$ cm$^{-3}$ implanted at 460 Kev; and d) Boron dopant with a doping concentration of $2E12$ cm$^{-3}$ implanted at 700 Kev to form the BCL regions 140. In FIG. 2I, the BCL implant mask 132 is removed followed by first carrying out an oxide break through etch to remove a top portion of the hard mask oxide layer 122' of about 300 Angstroms on top of the polysilicon layer 130". Then a polysilicon etch back process is carried out to etch the polysilicon layer 130" to a depth of about 0.4 micrometers below the top surface of the silicon substrate 110 forming the trenched gates 130 and polysilicon pickup gate 130' in the trenches 115 and 115'. The remaining hard mask oxide layer has a layer thickness of about 200 Angstroms.

In FIG. 2J, the manufacturing processes continue with a step of depositing a HDP oxide layer 145 having a layer thickness of about 3000 Angstroms followed by forming a BPSG layer 148 having a layer thickness of about 4300 Angstroms on top of the HDP oxide layer 145. In FIG. 2K, a self-aligned contact (SAC) photoresist mask 149 is applied to carry out a self-aligned contact oxide etch to remove the HDP oxide layer 145 and the BSPG layer 148 from the uncovered portion and stop at the top surface of the silicon substrate 110, where the edge of HDP oxide layer 145 and the BPSG layer 148 after masked etching is substantially aligned to the trench sidewall of the gate pickup trench 115' closer to the active trenches 115. In FIG. 2L, a mesa recess etch is performed to etch the silicon substrate to form a mesa recess 155 having a recess depth of about 0.3 micrometers. In FIG. 2M, the photoresist mask 149 is removed followed by a blanket body implantation with boron ions firstly at an energy level between 100 Kev and then at 600 Kev to form the body regions 150. In FIG. 2N, the processes proceeds by carrying out a blanket implantation to form the source regions 160 with Arsenide dopant at a doping concentration of about $4E15$ cm$^{-3}$ and at 80 Kev followed by an anneal process at 950 degree Celsius for 30 second. In FIG. 2O, a low temperature oxide deposition is carried out to form a thin oxide layer of about 800 Angstroms atop the structure followed by a blanket oxide etching process, for example plasma dry etch, to form an oxide spacer on each side surface of the oxide layer 145. Then, in FIG. 2P, a contact etch is performed, for example plasma dry etch, to open contact openings 168 with a contact trench depth 0.25 micrometers below the mesa surface. As shown in FIG. 2O, the pair of spacers 165 on top of the mesa between two active trenches 115 are symmetric through the center of the mesa such that the center of the contact opening 168 is substantially aligned with the center of the mesa. However in the mesa between the last active trench 115 and the gate pickup trench 115', the spacer 165" attached to the edge of the oxide layer 145 and the BPSG layer 148 is thicker and higher than the spacers 165 and spacer 165' attached on the side surface of the oxide layer 145 atop of the last active trench 115 such that the center of the contact opening formed by the spacers 165' and 165" is off center of the mesa between the last active trench 115 and the gate pickup trench 115' and closer to the last active trench 115. The spacer 165' has substantially the same size as the spacer 165. In FIG. 2Q, a contact implant 170 is formed at the bottom of the contact trenches 168, for example BF2 dopant with a doping concentration of $1E14$ cm$^{-3}$ at 20 Kev. In FIG. 2R, a poly pickup contact mask 172 is applied to open a polysilicon pickup contact trench 174.

In FIG. 2S, the mask 172 is removed followed by a rapid thermal anneal (RTA) followed by the deposition of the barrier layer on the side surface of the openings 168 and 174 (not shown), for example Ti/TiN barrier layer, then the contact trenches 168 and 174 are filled with tungsten then etched back to form tungsten plugs (W-plugs) 180, 180' and 180", where the center of the source/body contact 180 is substantially aligned with the center of the mesa between two adjacent active trenches 115 and the source/body contact 180" is off center of the mesa closer to the last active trench 115. In FIG. 2T, the processes are completed with the formation and patterning of source contact 190-S and gate pad 190-G followed by standard passivation formation and patterning processes (not specifically shown). As mentioned above, the gap g separating the source metal 190-S and gate metal 190-G extends across the edge of the HDP oxide layer 145 and the BPSG layer 148 substantially aligned with the trench sidewall of the gate pickup trench 115' closer to the active trenches 115.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a semiconductor power device in a semiconductor substrate comprising an active cell area and a termination area wherein the method comprising:

opening a plurality of gate trenches in a top portion of the semiconductor substrate in the active cell area and a gate pickup trench in the termination area having a greater width than the gate trenches in the active cell area and filling each of the gate trenches and the gate pickup trench with a conductive gate material followed by etching off the conductive gate material from a top portion of the trenches;

depositing a high density plasma (HDP) oxide layer and forming a borophosphosilicate glass (BPSG) insulation layer covering over a top surface followed by applying a self-aligned contact (SAC) photoresist mask to carry out a self-aligned contact etch to remove the BPSG insulation and the HDP oxide layers from a top surface in the active cell area of the semiconductor substrate in an uncovered area; and performing a mesa recess etch to etch the semiconductor substrate to etch off an entire top layer in the active cell area of the semiconductor substrate thus forming a mesa recess areas with a top mesa surface vertically below a top surface of the HDP oxide layer wherein the HDP oxide layer covering over the conductive gate material with the HDP oxide layer and the BPSG insulation layer covering over the gate pickup trench in the termination area.

2. The method of claim 1 further comprising:

depositing a low temperature oxide (LTO) spacer layer on sidewalls of the HDP insulation layer for defining mesa-center areas substantially in a middle portion of the recessed mesa areas.

3. The method of claim 2 further comprising:

etching the semiconductor substrate through the mesa-center areas to open contact trenches aligned with outer edges of the LTO spacer layer.

4. The method of claim 3 further comprising:

implanting through each of the contract trenches to form contact implant regions in the semiconductor substrate below a bottom surface of each of the contact trenches.

5. The method of claim 4 further comprising:

filling the contact trenches with a conductive contact material.

6. The method of claim 3 wherein:

the process of opening the contact trenches comprises a step of opening the contact trenches having a width substantially between 0.1 to 0.15 micrometers.

7. The method of claim 1 further comprising:

implanting body regions in the semiconductor substrate under the recessed mesa areas followed by implanting source regions of an opposite conductivity type in an upper portion of the body regions.

8. The method of claim 7 further comprising:

depositing a low temperature oxide (LTO) spacer layer on sidewalls of the HDP insulation layer for defining mesa-center areas substantially in a middle portion of the recessed mesa areas;

etching the semiconductor substrate through the mesa-center areas to open contact trenches penetrating through the source regions followed by implanting through the contact trenches to form contact implant regions in the semiconductor substrate below a bottom surface of the contact trenches; and filling the contact trenches with a conductive contact material for contacting the contact implant regions disposed below the bottom surface of the contact trenches.

9. The method of claim 7 further comprising:

forming a body clamping layer (BCL) of the same conductivity type as the body region to vertically extend below a bottom surface of the gate trenches in a peripheral area of the active cell area.

10. The method of claim 1 wherein:

the process of opening the gate trenches comprises a step of opening the gate trenches have a width approximately 0.25 micrometers and a distance between adjacent gate trenches having a pitch approximately 0.5 micrometers.

* * * * *